United States Patent [19]
Tai

[11] Patent Number: 5,619,447
[45] Date of Patent: Apr. 8, 1997

[54] FERRO-ELECTRIC MEMORY ARRAY ARCHITECTURE AND METHOD FOR FORMING THE SAME

[75] Inventor: Jy-Der D. Tai, Phoenix, Ariz.

[73] Assignee: Motorola, Inc., Schaumburg, Ill.

[21] Appl. No.: 433,880

[22] Filed: May 2, 1995

[51] Int. Cl.⁶ .................................................. G11C 7/00
[52] U.S. Cl. ........................... 365/145; 365/63; 365/117; 365/65; 365/230.04
[58] Field of Search .............................. 365/145, 63, 65, 365/117, 189.01, 45, 154, 207, 230.04

[56] References Cited

U.S. PATENT DOCUMENTS

| | | | |
|---|---|---|---|
| 4,873,664 | 10/1989 | Eaton, Jr. ................................. | 365/145 |
| 5,089,992 | 2/1992 | Shinohara ................................ | 365/63 |
| 5,224,069 | 6/1993 | Natori ...................................... | 365/145 |
| 5,276,650 | 1/1994 | Kubota ..................................... | 365/207 |
| 5,345,414 | 9/1994 | Nakamura ............................... | 365/145 |
| 5,392,234 | 2/1995 | Hirano et al. ........................... | 365/145 |
| 5,424,995 | 6/1995 | Miyazaki et al. ....................... | 365/154 |

OTHER PUBLICATIONS

Joseph T. Evans and Richard Womack, "An Experimental 512–bit Nonvolatile Memory with Ferroelectric Storage Cell", IEEE J. Solid–State Circuits,vol. 23, No. 5, pp. 1171–1175, Oct. 1988.

Primary Examiner—David C. Nelms
Assistant Examiner—Vu A. Le
Attorney, Agent, or Firm—Gary W. Hoshizaki

[57] ABSTRACT

A ferro-electric memory array (41) having a reduced size and increased performance is disclosed herein. The ferro-electric memory array (41) is arrayed in memory cell columns and memory cell rows. Each memory cell column shares a BIT or BITBAR line with an adjacent memory cell column. Two row enable lines are provided to each memory cell row. The row enable lines alternately couple to memory cells of a memory cell row to prevent a contention condition. Sharing BIT and BITBAR lines with adjacent memory cell columns reduces a width of the ferro-electric memory array (41) which reduces the resistance on each line CP for a memory cell row. The result is a memory array that is capable of operating at higher speeds. Also, using more than one row enable line in each row reduces the number of memory cells accessed in a read or write operation. This increases the endurance of the ferro-electric memory array (41) by a factor of two.

5 Claims, 5 Drawing Sheets 5,619,447

FERRO-ELECTRIC MEMORY ARRAY ARCHITECTURE AND METHOD FOR FORMING THE SAME

BACKGROUND OF THE INVENTION

This invention relates, in general, to semiconductor memories, and more particularly, to ferro-electric memory architectures.

A ferro-electric memory (FeRAM) is a non-volatile memory. It is useful for applications requiring data retention when power is removed from the memory. Both read and write operations are performed to a FeRAM. FeRAM read and write cycle times are within a range of 200 to 1000 nanoseconds for a 4096 bit memory. The memory size and memory architecture affect the read and write access times of a FeRAM. EEPROMs and FLASH EEPROMs are well known non-volatile memories that compete with ferro-electric memories.

The non-volatility of a ferro-electric memory is due to the bistable characteristic of a ferro-electric memory cell. Two types of memory cells are used, a single capacitor memory cell and a dual capacitor memory cell. The single capacitor memory cell increases density but is less immune to noise and process variations, and requires a voltage reference for determining a stored memory state. The dual capacitor memory cell stores complementary signals allowing differential sampling of the stored information and is stable.

A dual capacitor ferro-electric memory cell in a memory array couples to a BIT and a BITBAR line that is common to many other memory types (for example, static random access memories). Memory cells of a memory block are formed in memory rows and memory columns. The dual capacitor ferro-electric memory cell comprises two transistors and two ferro-electric capacitors. A first transistor couples between the BIT line and a first capacitor. A second transistor couples between the BITBAR line and a second capacitor. The first and second capacitors have a common terminal or plate to which a signal is applied for polarizing the capacitors.

In a write operation, the first and second transistors of the dual capacitor ferro-electric memory cell are enabled to couple the capacitors to the complementary logic levels on the BIT line and the BITBAR line corresponding to a logic state to be stored in memory. The common terminal of the capacitors is pulsed during a write operation to polarize the dual capacitor memory cell to one of the two logic states.

In a read operation, the first and second transistors of the dual capacitor memory cell are enabled to couple the information stored on the first and second capacitors to the BIT line and the BITBAR line. A differential signal is generated across the BIT line and the BITBAR line by the dual capacitor memory cell. The differential signal is sensed by a sense amplifier which provides a signal corresponding to the logic level stored in memory. A characteristic of a ferro-electric memory is that a read operation is destructive in some applications. The data in a memory cell must be rewritten back to the memory cell after the read operation is completed.

A memory cell of a ferro-electric memory is limited to a finite number read and write operations before the memory cell becomes unreliable. The number of operations that can be performed on a ferro-electric memory is known as the endurance of a memory. The endurance is an important factor in many applications that require a nonvolatile memory. Other factors such as memory size, memory speed, and power dissipation also play a role in determining if a ferro-electric memory is viable in the memory market.

It would be of great benefit if a ferro-electric memory could be provided that has increased endurance, higher speed, increased density, and dissipates less power.

DETAILED DESCRIPTION OF THE DRAWINGS

Figure 1:
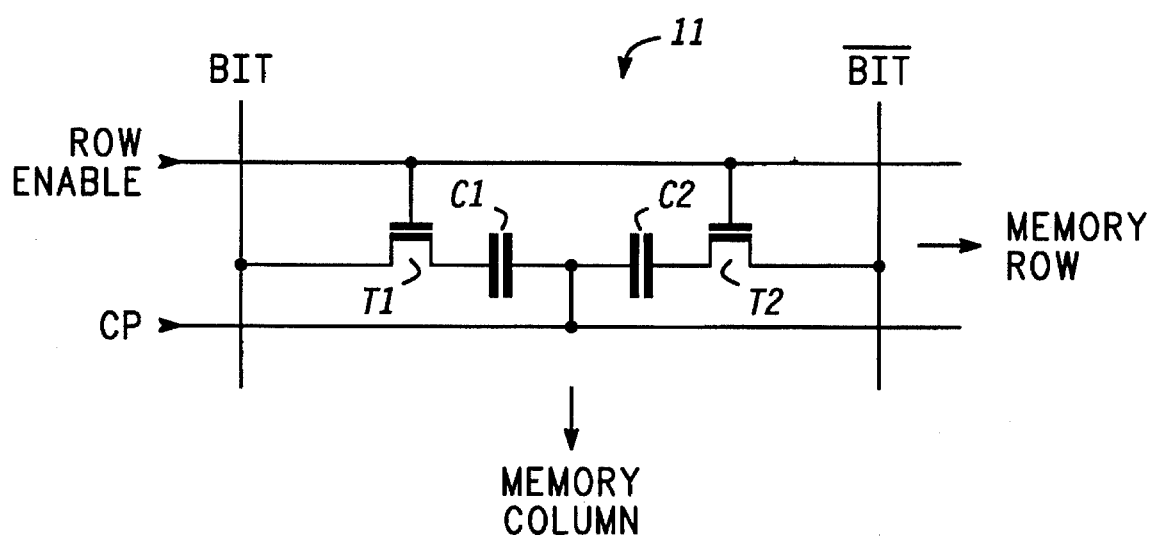
FIG. 1 is a schematic diagram of a ferro-electric memory cell.

A ferro-electric memory (FeRAM) is named for the unique properties of its memory cell. A ferro-electric memory cell utilizes a ferro-electric film capacitor that incorporates a non-linear dielectric material. The ferro-electric film capacitor retains information even if power from the memory is removed. In some applications, a read operation on a ferro-electric memory cell is a destructive operation. A rewrite operation is performed after every read operation to restore the information back into a memory cell. Information pertaining to a ferro-electric capacitor, memory cell, and memory architecture is available in an article titled "An Experimental 512-bit Nonvolatile Memory with Ferro-electric Storage Cell", by Joseph T. Evans and Richard Womack, printed in the I.E.E.E. Journal of Solid-State Circuits, vol. 23, no. 5., pages 1171–1175, on October 1988 and a U.S. Pat. No. 4,873,664, titled "Self Restoring Ferro-electric Memory" by S. Sheffield Eaton, Jr., issued on Oct. 10, 1989, both of which are hereby incorporated by reference.

A ferro-electric memory has many advantages over other non-volatile memories. For example, an EEPROM is a non-volatile memory that has widespread popularity and is comparable to a ferro-electric memory. First, a ferro-electric memory operates at voltages lower than three volts. A general trend in the semiconductor industry is to decrease an operating voltage of semiconductor chips to reduce power thereby making a ferro-electric memory suitable for integration on future generations of semiconductors. An EEPROM requires additional circuitry, such as a charge pump circuit for providing a voltage greater than a power supply voltage for operation. The use of a charge pump circuit is not compatible with the trend to reduce power supply voltages since the lower operating voltages of future semiconductors will require a more complex charge pump circuit to attain the voltage required for an EEPROM.

Second, write times on a ferro-electric memory are fast when compared with other non-volatile memories (on the order of 500 nanoseconds for a 4 kilobit memory). A write on an EEPROM is approximately 10 times longer. Also, an EEPROM requires a block erase before data is rewritten over a block. A block erase is not needed in a ferro-electric memory. A block erase for an EEPROM is an extremely slow procedure, typically taking milliseconds to perform.

Third, most non-volatile memories have a finite number of operations which can be performed before its reliability is questionable. A ferro-electric memory is capable of performing six orders of magnitude greater operations than an EEPROM. The endurance of a non-volatile memory is a term used to indicate the number of operations that a memory is guaranteed reliable.

Finally, two types of memory cells are used to form a ferro-electric memory array. A very stable two transistor and two capacitor memory cell (2T/2C) or a one transistor and one capacitor memory cell (1T/1C) are used. The density of either memory cell does not approach the density of currently offered EEPROM memory cells but as the technology matures it is conceivable for a ferro-electric memory cell to approach the size of an EEPROM or DRAM memory cell.

FIG. 1 is a schematic diagram of a 2T/2C (two transistor/two capacitor) ferro-electric memory cell 11. Memory cell 11 comprises transistors T1 and T2, and capacitors C1 and C2. Transistor T1 couples between a BIT line and capacitor C1. Capacitor C1 couples between transistor T1 and a control terminal CP. Transistor T2 couples between a BITBAR line and capacitor C2. Capacitor C2 couples between transistor T2 and the control terminal CP. The gates of both transistors T1 and T2 couple to a ROW ENABLE terminal. BITBAR described herein corresponds to a word BIT with a line drawn above in the FIGURES.

Capacitors C1 and C2 are formed by placing a ferro-electric material between two conductive plates. The ferro-electric material has a non-linear dielectric characteristic that allows the memory cell to retain information when power is removed and restored. The control terminal CP couples to a common bottom plate of capacitors C1 and C2. The control terminal CP is used to polarize the ferro-electric memory cell of a memory cell row. The ROW ENABLE terminal enables transistors T1 and T2 for respectively coupling capacitors C1 and C2 to the BIT and BITBAR lines for a read or write operation.

Figure 2:
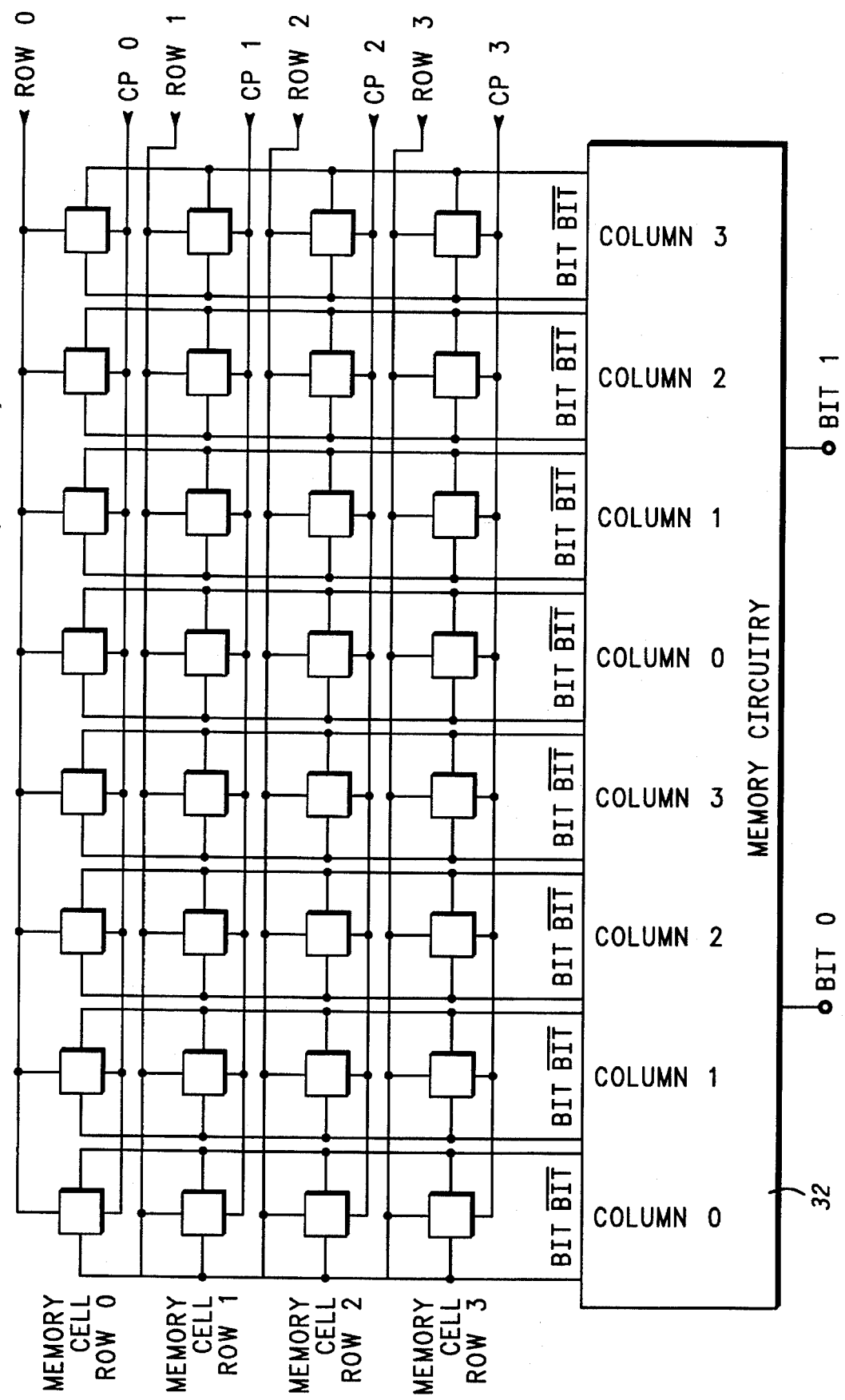
FIG. 2 is a prior art block diagram of a ferro-electric memory cell array having separate BIT and BITBAR lines for each memory cell column.

FIG. 2 is a prior art block diagram of a ferro-electric memory cell array 31 illustrating eight memory cell columns and four memory cell rows. In general, the block diagram is a representation of how ferro-electric memory cells are arrayed in memory cell columns and rows and is not particular to the exact configuration shown. Memory cell array 31 inputs/outputs two bits, a BIT0 terminal and a BIT1 terminal are the input/output (I/O) to memory cell array 31.

Each memory cell row comprises eight memory cells and has a corresponding row enable line and a line CP. The memory cell rows are labeled MEMORY CELL ROW0–3. The row enable lines are labeled ROW0–ROW3 and the lines CP are labeled CP0–CP3. A line CP of each memory cell row couples to a common plate of the two capacitors within each memory cell as shown in FIG. 1. Each memory cell column comprises four memory cells and has its own BIT and BITBAR line. The eight memory cell columns are grouped into two groups of four memory cell columns, each column in each column group is respectively labeled COLUMN0–COLUMN3. A first group of columns corresponds to the BIT0 terminal and a second group of columns corresponds to the BIT1 terminal.

A memory circuitry 32 couples to the BIT and BITBAR line of each memory cell column of memory cell array 31. Memory circuitry 32 performs a read or write operation to an enabled memory cell in each column group. Data is input and output at terminals BIT0 and BIT1 coupled to memory circuitry 32. In general, sense amplifiers and multiplexing circuitry reside in memory circuitry 32.

A row enable signal applied to a row enable line (ROW0–ROW3) enables each memory cell of the enabled memory row. The line CP corresponding to the enabled row is pulsed to polarize a ferro-electric cell for either a read or write operation. Multiplexers within memory circuitry 32 couple one of the four memory cell columns of each column group to sense amplifier circuitry.

Data to be written to memory cell array 31 is applied to the BIT0 and BIT1 terminals during a write operation. Multiplexers couple the data to a particular memory cell column of each column group. In the preferred embodiment, a same column is enabled in both column groups, for example, COLUMN1 is enabled in both the first and second column groups. The data applied to the BIT0 terminal is transferred to the BIT and BITBAR lines of COLUMN1 of the first group of columns. Similarly, the data applied to the BIT1 terminal is transferred to the BIT and BITBAR lines of COLUMN1 of the second group of columns. A row enable signal is applied, for example, to row enable line ROW3 for writing to memory cells corresponding to COLUMN1 (of the first and second column groups) and ROW3. The line CP3 is also pulsed such that the enabled memory cells will store the data on the corresponding BIT and BITBAR lines by polarizing the ferro-electric memory cell in one of two logic states.

A read operation couples a memory cell to its corresponding BIT and BITBAR lines. The memory cell generates a differential voltage across the BIT and BITBAR lines such that a sense amplifier in memory circuitry 32 senses the voltage differential and outputs a logic level corresponding to the logic state stored in the memory cell. A column and row are selected as described in the write operation. The read operation of a ferro-electric memory is destructive to the logic state stored in the memory cell. The data sensed by the sense amplifier is rewritten back to the ferro-electric memory cell by switching the polarization back to its original state. A CP line of a corresponding enabled memory row is pulsed during a read operation.

As mentioned previously, a ferro-electric memory cell has a finite number of read/write operations before it fatigues and becomes unreliable for memory storage. Based on the memory architecture shown in FIG. 2, each memory cell of a row is accessed when the row is enabled, yet only two memory cells are being either written to or read from. Enabling every memory cell in a memory row decreases the lifetime (endurance) of a ferro-electric memory by continuously exercising memory cells that are not used. Also, power consumption is increased by enabling and disabling a large number of memory cells in a memory cell row with each read or write operation.

Operating speed is directly related to memory cell layout. In particular, the resistance of a CP line has a major impact on read or write access times of a ferro-electric memory. A memory array architecture as shown in FIG. 2 does not lend itself to high speed read and write times due to the time required to pulse a line CP. A resistance of a CP line is a direct function of a memory cell layout and the material which forms the common conductive plate of the two capacitors within a ferro-electric memory cell. In the preferred embodiment, the common conductive capacitor plate of a memory cell couples to an adjacent memory cell thereby inherently forming the line CP. A wide ferro-electric memory cell increases the length of a line CP which directly corresponds to increasing the resistance of the line CP. In general, the resistance of a CP line dominates any parasitic capacitance effect in slowing a ferro-electric memory. This is due to the fact that a signal applied to a CP line drives the capacitors of every memory cell in a memory row. The total capacitance value of all the capacitors in a memory cell row and the resistance of its CP line form a RC time constant that determines at what frequency the CP line is pulsed. The net result is that the speed of a ferro-electric memory could be limited by the maximum speed that the line CP is capable of being pulsed.

Each memory cell column has separate BIT and BITBAR lines. BIT and BITBAR lines are typically run in metal to minimize resistance. A metal to metal spacing is required between each adjacent memory cell to prevent metal shorts. The spacing between adjacent memory cells in a row will further increase CP line resistance.

A solution for increasing the speed of operation of a ferro-electric memory is to reduce a memory cell width thereby decreasing a resistance of a line CP. A further improvement is to eliminate metal to metal spacing between adjacent memory cells. Sharing bit lines between adjacent memory cells reduces the size of a memory array and reduces the resistance of the line CP. Furthermore, a memory array architecture that does not access all memory cells of a row will increase the endurance of the ferro-electric memory. A ferro-electric memory having increased operating speed, increased endurance, reduced power consumption, and a smaller memory array size is achieved by implementing the concepts described above.

Figure 3:
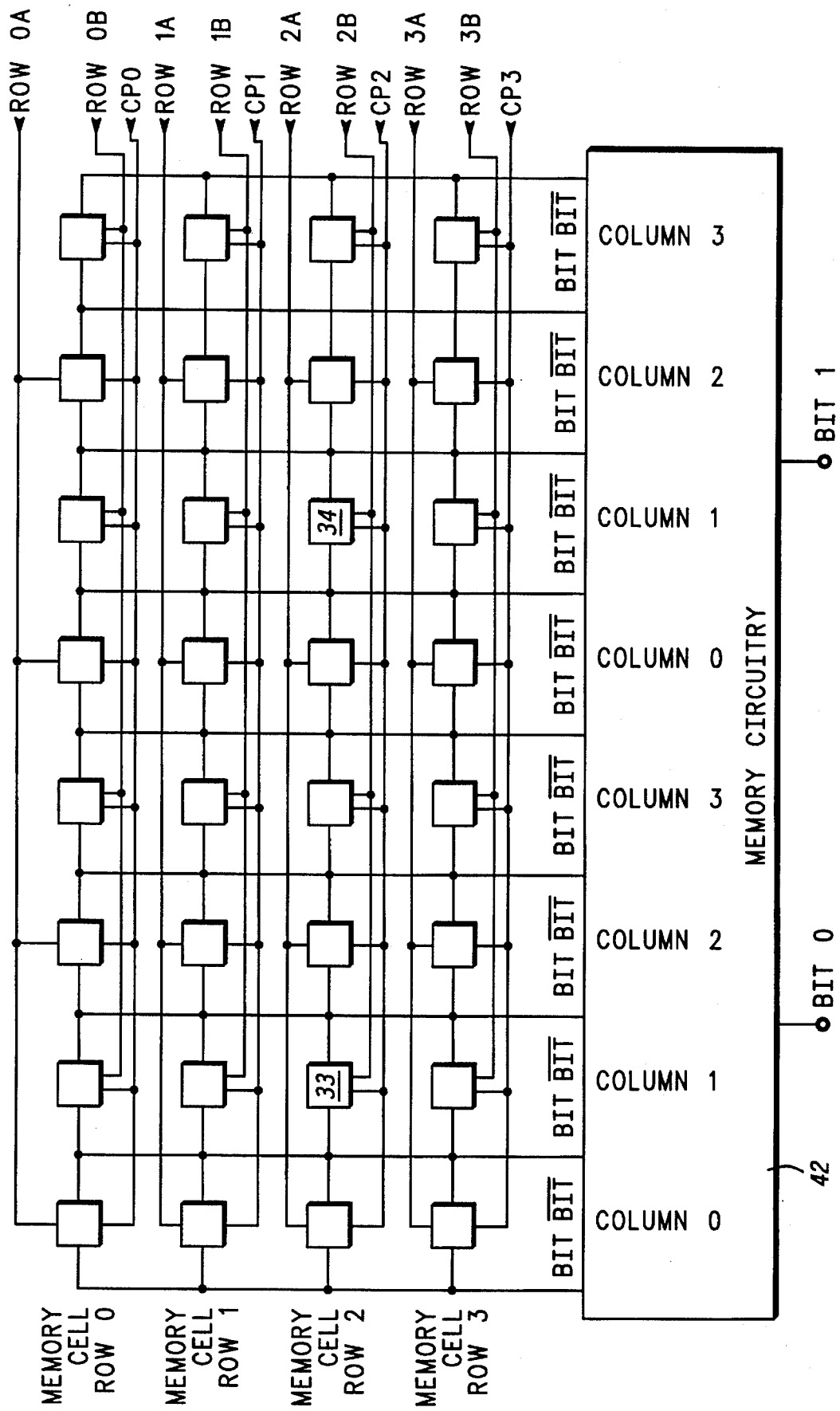
FIG. 3 is a block diagram of a ferro-electric memory cell array having shared BIT and BITBAR lines in accordance with the present invention.

FIG. 3 is a block diagram of a ferro-electric memory cell array 41 having eight memory cell columns and four memory cell rows that operate as a functional equivalent to memory cell array 31 of FIG. 2. The four memory cell rows are labeled MEMORY CELL ROW0 to ROW3. The eight memory cell columns are divided into two groups of memory cell columns labeled COLUMN0–COLUMN3. A first group of memory cell columns corresponds to a BIT0 terminal and a second group of memory cell columns corresponds to a BIT1 terminal.

Each memory cell row has eight memory cells, four memory cells couple to a first row enable line and the remaining four memory cells couple to a second row enable line. For example, MEMORY CELL ROW0 has alternating memory cells coupled to a row enable line ROW0A and a row enable line ROW0B. A line CP0 is coupled to each memory cell of a memory cell row. Enabling half the memory cells of a memory cell row increases the endurance of a ferro-electric memory by a factor of two since only half the memory cell row are enabled with each operation. On average, two read/write operations are performed to access a same number of memory cells as the memory architecture of FIG. 2. Thus, twice as many read/write operations can be performed on ferro-electric memory-cell array 41 before memory cell fatigue is an issue thereby increasing the longevity and reliability of a ferro-electric memory. It is possible to add more row enable lines to a memory cell row to further increase the endurance of a ferro-electric memory but row decoding circuitry for providing row enable signals would be more complex and the impact of routing of the added enable lines would have to be addressed.

A significant reduction in the resistance of lines CP0–CP3 is achieved by sharing BIT/BITBAR lines of adjacent memory cell columns. For example, a BITBAR line of COLUMN0 is also a BIT line of COLUMN1, similarly a BIT line of COLUMN 3 is a BITBAR line of COLUMN2. Sharing BIT/BITBAR lines removes metal to metal spacing requirements between adjacent memory cells and eliminates a BIT/BITBAR line that are used in the memory array architecture illustrated in FIG. 2. Sharing BIT/BITBAR lines reduces an overall length of a line CP for a memory cell row thereby reducing resistance. Sharing BIT/BITBAR lines also decreases the size of the memory cell array. A reduction in length corresponds to a reduction in resistance of lines CP0–CP3. The reduced resistance on lines CP0–CP3 allows a CP line to be operated at a higher frequency.

Alternating row enable lines to adjacent memory cells insures that memory cells sharing a same BIT or BITBAR line are never enabled simultaneously which would create a contention problem. Coupling BIT or BITBAR lines with adjacent memory cells does increase a capacitive loading on an enabled memory cell. For example, memory cells interior to memory cell array 41 are coupled to 7 other memory cells whereas the memory cells of FIG. 2 are coupled to only three other memory cells. Evaluations of some ferro-electric memory arrays indicate that a capacitance ratio of approximately two between a BIT/BITBAR line capacitance and a capacitance of a ferro-electric memory cell capacitor is ideal for reading and rewriting. In some applications, a ferro-electric memory cell arrays not sharing BIT and BITBAR lines requires more BIT/BITBAR line capacitance to meet the ideal ratio. Thus, increasing the BIT/BITBAR line capacitance by sharing BIT and BITBAR lines sometimes moves a memory cell column closer to the ideal capacitive ratio and is not a negative attribute.

A memory circuitry 42 couples to the BIT line and the BITBAR line of each memory cell column of memory cell array 41. Memory circuitry 42 performs a read or write operation to an enabled memory cell of each group of memory cell columns. Data is input and output at terminals BIT0 and BIT1 coupled to memory circuitry 42. In general, sense amplifiers and multiplexing circuitry reside in memory circuitry 42.

A row enable signal is applied to one of the two row enable lines of a memory cell row. The line CP corresponding to the enabled memory cell row is pulsed during either a read or write operation to polarize the ferro-electric memory cells. Multiplexers within memory circuitry 42 couple one of the four memory cell columns of each memory cell column group to sense amplifier circuitry.

In a write operation, data is applied to the BIT0 and BIT1 terminals. Multiplexers in memory circuit 42 couple the data to a particular memory cell column. In the preferred embodiment, the data applied to the BIT0 and BIT1 terminals is transferred to the BIT and BITBAR lines of identically named memory cell columns of the first and second group of memory cell columns. For example, the data applied to the BIT0 and BIT1 terminals are respectively coupled to the BIT and BITBAR lines of COLUMN1 of the first group of memory cell columns and COLUMN1 of the second group of memory cell columns. A row enable signal is applied to one of the two row enable lines of a memory cell row, for example, row enable line ROW2B is enabled. Data corresponding to BIT0 and BIT1 is respectively written to the BIT and BITBAR lines of the COLUMN1 of the first and second column groups. Memory cells 33 and 34 are coupled to the BIT and BITBAR lines which writes the data to each memory cell. The line CP3 is also pulsed such that the enabled memory cells 33 and 34 store the data on the corresponding BIT and BITBAR lines by polarizing each ferro-electric memory cell in one of two logic states.

A read operation couples a memory cell to its corresponding BIT and BITBAR line. Memory cell columns and a memory cell row is enabled similar to that described in the write operation. A memory cell coupled to a BIT and BITBAR line generates a differential voltage across the BIT and BITBAR line such that a sense amplifier in memory circuitry 42 amplifies the differential voltage and outputs a logic level corresponding to a logic state stored in the memory cell. As mentioned previously, a read operation is destructive to the logic state stored in a memory cell. The data sensed by the sense amplifier is rewritten back to the ferro-electric memory cell by switching the polarization back to its original state. A CP line of a corresponding enabled memory row is pulsed during a read operation.

Sharing BIT/BITBAR lines with adjacent memory cell columns within a memory cell array and increasing the number of row enable lines within a memory cell row provides many benefits. First, the memory cell array is reduced in size by eliminating a metal line and metal to metal spacings between adjacent memory cells of a memory cell row. Second, the resistance of a line CP is lowered as the width of a memory cell row is reduced. Lowering the resistance of a line CP (CP0–CP3) allows a higher operating speed for a ferro-electric memory. Third, power consumption is reduced by enabling only half the memory cells of a memory cell row. Finally, the endurance of a ferro-electric memory is increased by reducing the number of memory cells that are accessed with each read or write operation.

Figure 4:
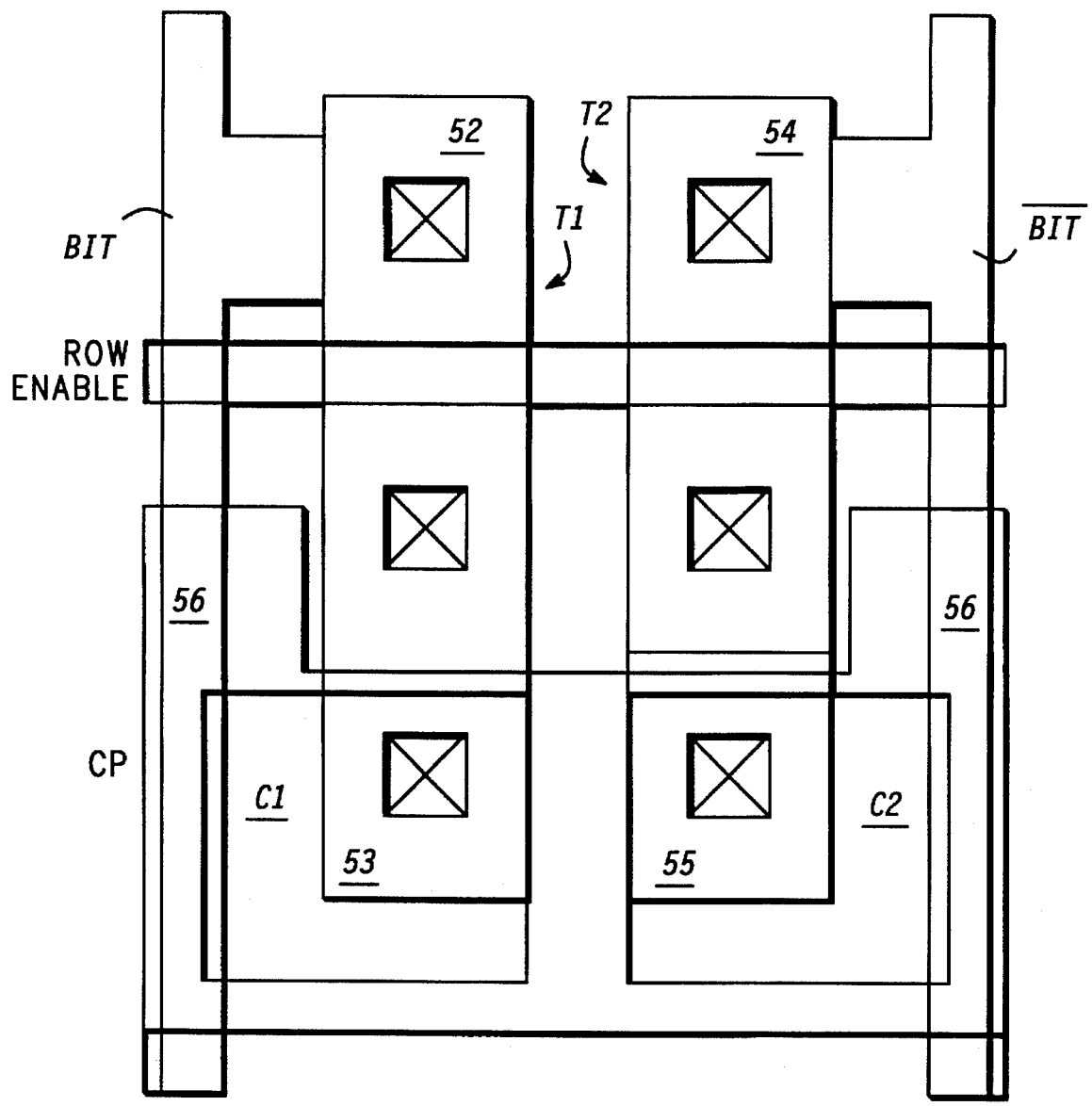
FIG. 4 is a layout of a ferro-electric memory cell that shares a BIT or BITBAR line with an adjacent memory cell in accordance with the present invention.

FIG. 4 is a layout of a ferro-electric memory cell 51 corresponding to the schematic diagram of FIG. 1. Ferro-electric memory cell 51 comprises transistors T1 and T2, and capacitors C1 and C2. Ferro-electric memory cell 51 is optimized to minimize the width of the memory cell. Reducing the width of the memory cell lowers the resistance of a line CP.

Transistor T1 has a drain 52 coupled to a BIT line, a gate coupled to a ROW ENABLE line, and a source coupled to a conductive plate 53 of capacitor C1. Transistor T2 has a drain 54 coupled to a BITBAR line, a gate coupled to the ROW ENABLE line, and a source coupled to a conductive plate 55 of capacitor C2. A common conductive plate 56 of capacitors C1 and C2 couples to a line CP.

The width of the ferro-electric memory cell 51 is reduced by forming transistors T1 and T2 vertically (a drain and source are vertically aligned) in the memory cell. A minimum width of ferro-electric memory cell 51 is determined by a layout of transistors T1 and T2, and the BIT and BITBAR lines that have a layout that runs parallel to the devices. Capacitors C1 and C2 are formed having conductive plates 53 and 55 within the boundaries of the ferro-electric memory cell 51 defined by the BIT and BITBAR lines. The resistance of common conductive plate 56 is reduced by widening the conductive material near the boundary of memory cell 51 where it couples to an adjacent memory cell. The BIT and BITBAR lines are drawn one half of its actual width since it abuts to an adjacent memory cell in the shared BIT and. BITBAR line memory architecture.

Figure 5:
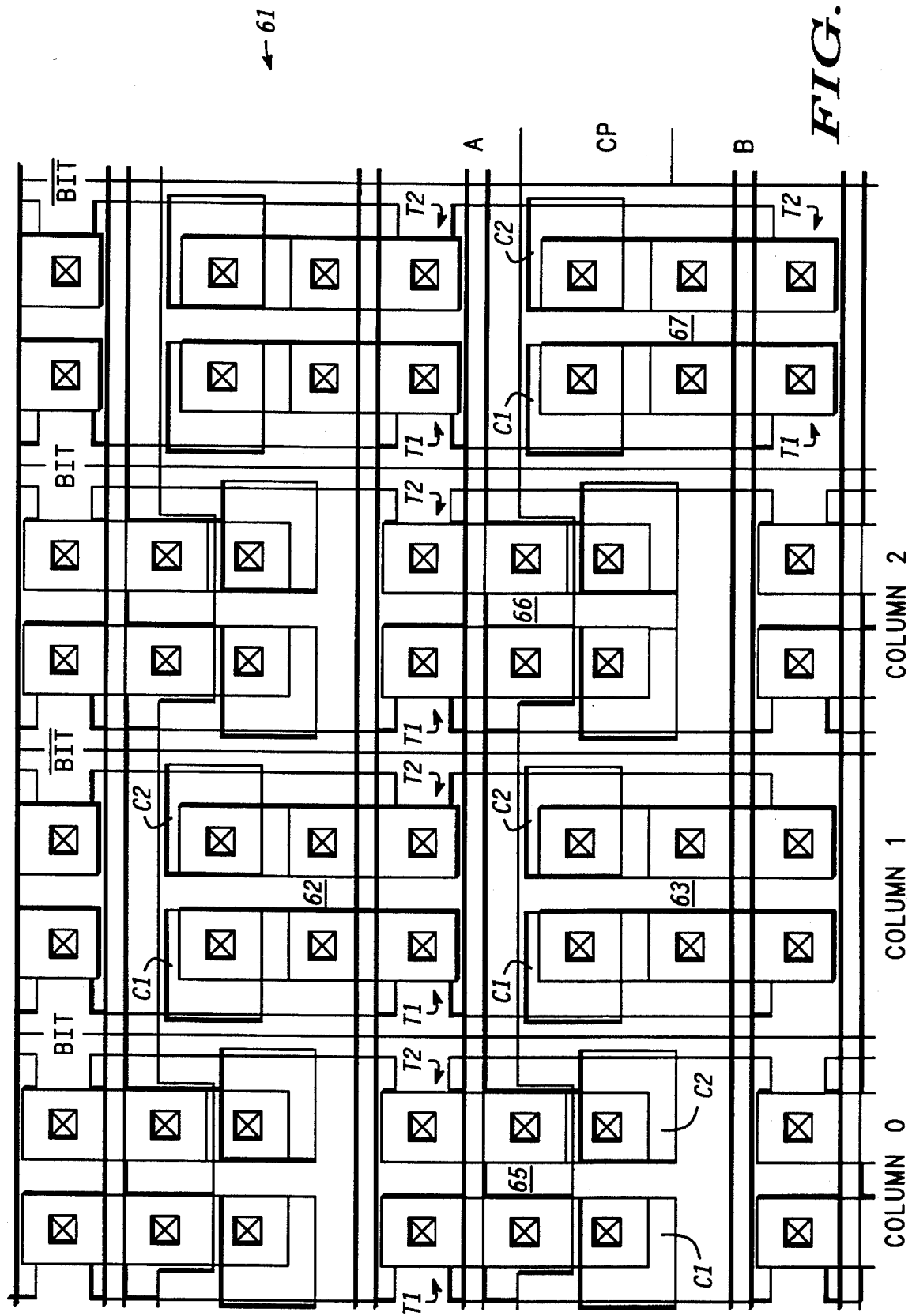
FIG. 5 is a layout showing a memory cell column and a memory cell row in accordance with the present invention.

FIG. 5 is a portion of a layout of a memory cell array 61 illustrating a layout of a memory cell row and a memory cell column. The memory cells of memory cell array 61 correspond to the layout of memory cell 51 in FIG. 4. A portion of a memory cell column comprises memory cells 62, 63, and 64. A portion of a memory cell row comprises memory cells 65, 63, 66, and 67. FIG. 5 is an illustration of how the memory cells tie together in a shared BIT and BITBAR memory architecture as shown in FIG. 3.

Memory cells 62, 63, and 64 are aligned vertically within memory cell array 61 to form a column. Memory cells 62, 63, and 64 each couple to a BIT and BITBAR line of the column.

Memory cells 65, 63, 66, and 67 form a memory row. Memory cell of a row sharing a row enable line align to one another. For example, memory cells 65 and 66 horizontally align to one another and memory cells 63 and 67 align to one another. In the preferred embodiment, adjacent transistors are staggered having a row enable line A near the top of the memory cell row and a row enable line B near the bottom of the memory cell row. Each memory cell abuts to an adjacent memory cell such that the adjacent memory cells share a BIT or BITBAR line. A line CP centrally couples through the memory cell row between the row enable lines A and B.

By now it should be appreciated that a ferro-electric memory array architecture has been provided. The memory array architecture and method includes sharing a BIT or BITLINE with an adjacent memory cell column. Contention problems are avoided by providing two enable lines to each memory cell row. The enable lines couple to alternate cells such that two adjacent memory cell columns are never enabled simultaneously. Endurance of the memory array is also increased by accessing half the memory cells in a memory row during each read and write. The memory array architecture produces a smaller denser memory array that should allow more memories to be formed on each wafer. The width of a memory row is significantly reduced which decreases the resistance of a CP line. The memory can be operated at higher speeds since each CP line has reduced delay that allows faster cycle times. Power dissipation is reduced due to both the CP line and the use of more than one row enable line per memory cell row.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A ferro-electric memory array comprising a plurality of memory cells arrayed in a plurality of memory cell rows and a plurality of memory cell columns wherein each memory cell is coupled to a pair of BIT lines to generate a differential voltage thereacross when enabled and wherein adjacent memory cell columns of said plurality of memory cell columns share a BIT line.

2. The ferro-electric memory array as recited in claim 1 wherein each memory cell row of said plurality of memory cell rows has more than one row enable line.

3. The ferro-electric memory array as recited in claim 2 further including:

a first row enable line for each memory cell row of said plurality of memory cell rows; and a second row enable line for each memory cell row of said plurality of memory cell rows wherein said first and second row enable lines alternately couple to memory cells of each memory cell row.

4. The ferro-electric memory array as recited in claim 3 wherein one of said first and second row enable lines of each memory cell row is enabled at a time for preventing a contention condition and for increasing an endurance of the ferro-electric memory array.

5. The ferro-electric memory array as recited in claim 1 wherein each memory cell of the ferro-electric memory array comprises two transistors and two ferro-electric capacitors and wherein a drain and a source of said two transistors of are aligned vertically within each memory cell to minimize a width.

* * * * *